United States Patent

[11] 3,577,633

[72] Inventors Makoto Homma
Tokyo;
Toshiaki Saito, Kodaira-shi, Japan

[21] Appl. No. 864,288
[22] Filed Oct. 1, 1969
[45] Patented May 4, 1971
[73] Assignee Hitachi, Ltd.
Tokyo, Japan
[32] Priority Dec. 2, 1966
[33] Japan
[31] 41/78682
Continuation of application Ser. No. 685,878, Nov. 27, 1967, now abandoned.

[54] METHOD OF MAKING A SEMICONDUCTOR DEVICE
8 Claims, 24 Drawing Figs.

[52] U.S. Cl. .......... 29/588, 29/589
[51] Int. Cl. .......... B01j 17/00, H01l 1/10
[50] Field of Search .......... 29/576 (S), 588, 589, 590, 591, 628

[56] References Cited

UNITED STATES PATENTS

| | | | |
|---|---|---|---|
| 3,118,016 | 1/1964 | Stephenson | 174/68.5 |
| 3,171,187 | 3/1965 | Ikeda et al. | 29/576 |
| 3,281,628 | 10/1966 | Bauer et al. | 317/234 |
| 3,298,087 | 1/1967 | Hunt | 29/588 |

*Primary Examiner*—John F. Campbell
*Assistant Examiner*—W. Tupman
*Attorney*—Craig and Antonelli

ABSTRACT: A method of assembly of a transistor, wherein a lead support member and pairs of collector lead molds are punched in advance in a tape-shaped metal sheet; a lead support member corresponding to said lead support member and pairs of emitter-base lead molds are punched in another tape-shaped metal sheet; a collector electrode of a planar type transistor is put into contact with the center of said collector lead; the position of the end parts of the base and emitter leads with respect to the position of said collector lead is defined by piling up said two support members and thereby the end parts of said two leads are put into contact with said base and emitter electrodes of the transistor; all of said leads and electrodes corresponding thereto are coupled mutually by soldering; said transistor part is molded with resin; and said leads are removed from said respective support members.

INVENTORS
MAKOTO HOMMA
TOSHIAKI SAITO

BY Craig & Antonelli
ATTORNEYS

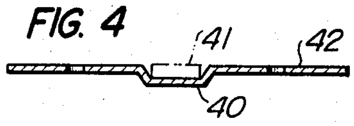
FIG. 5
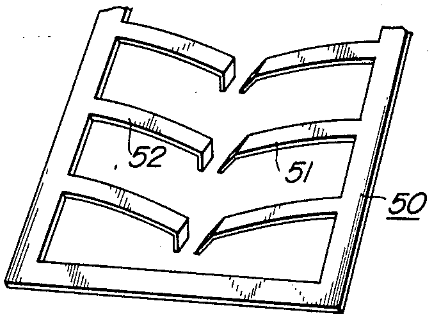
FIG. 6
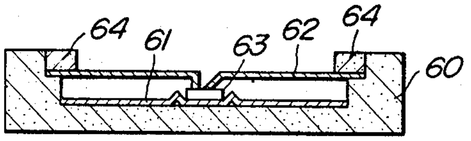
FIG. 7a
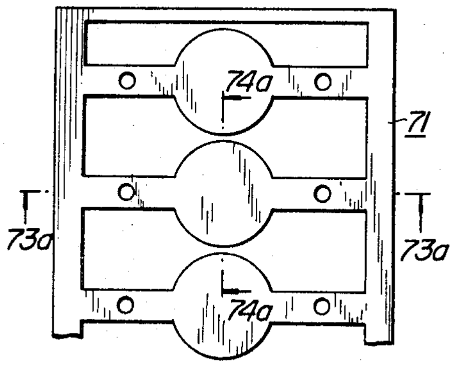
FIG. 7b
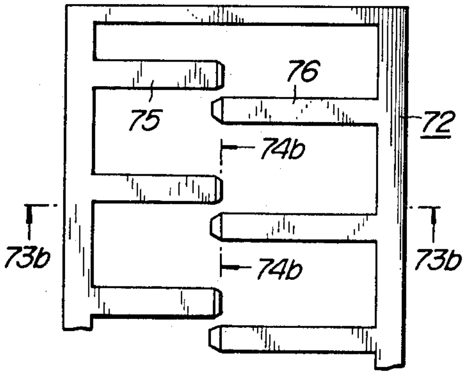
FIG. 8a
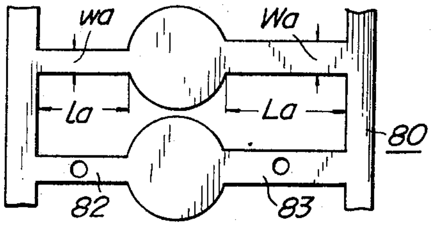
FIG. 8b
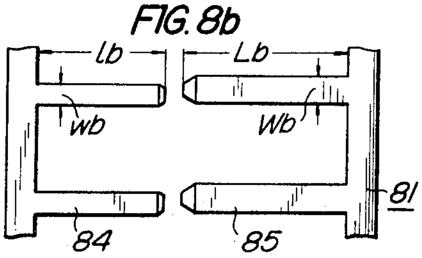
FIG. 9a
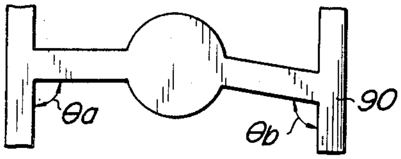
FIG. 9b
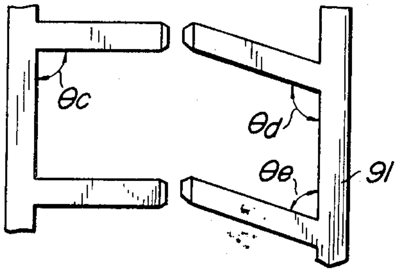
INVENTORS
MAKOTO HOMMA
TOSHIAKI SAITO
BY Craig & Antonelli
ATTORNEYS

INVENTORS
MAKOTO HOMMA
TOSHIAKI SAITO

BY Craig & Antonelli
ATTORNEYS

METHOD OF MAKING A SEMICONDUCTOR DEVICE

This is a continuation of application Ser. No. 685,878, filed Nov. 27, 1967, now abandoned.

BACKGROUND OF THE INVENTION

This invention relates to a novel method of making a semiconductor device and more particularly to an improved method of assembly of a resin mold type semiconductor device.

The development of surface passivation techniques of a semiconductor element, particularly of a silicon semiconductor element, has contributed greatly to the simplification of the assembly and sealing operations. As a result, the element has become miniaturized and cheaper without reducing the reliability thereof. However, for example, in the manufacture of a conventional resin or plastic mold type semiconductor element, a complicated process of connecting an outgoing lead and an electrode of the element with a connector made of Au, etc. is still indispensable due to the smallness of the element.

On the other hand, the urgent requirements in the field of manufacture of a semiconductor device include simplification of the manufacturing process, miniaturization of the element and cost reduction. However, in a power semiconductor element, high frequency high-power element, etc., the body of the semiconductor element and its electrodes are formed in a way that they have large cross sections in the direction of the current in order to make them capable of withstanding a large current and thus they are large.

Consequently, accessories like outgoing leads, a sealing case, etc. become large and the element becomes expensive. Therefore, it is quite profitable to satisfy said requirements particularly in such an element.

Now, a conventional method of making a semiconductor device and more particularly a conventional method of assembly will be briefly sketched with reference to FIG. 1 in order to make the above description and the following explanation of the present invention more comprehensible.

Various methods of making semiconductor devices are known and the most general methods include the one illustrated in FIG. 1. In the FIG., 1 indicates a semiconductor element, 2 indicates its electrodes, 3 designates a support member of the semiconductor element and 4 shows outgoing lead wires placed in said support member and electrically insulated by insulators 5. In such a structure, the electrodes 2 of the semiconductor element 1 and the outgoing lead wires 4 are connected with connector wires 6 using a welding device (e.g. nail-head bonder) and then the semiconductor element 1 is sealed airtight with a metal cap 7 or molded with resin (not shown in the FIG.) to stabilize the electrical characteristics of the element. However, according to such conventional methods the element becomes quite expensive since the form of each part is complicated, a special mechanical device must be used in connecting connector wires, the connector wires easily come off with a mechanical shock, etc. Moreover, many connections are present, and many manufacturing processes are required. Thus, such conventional methods are inconvenient and disadvantageous from an industrial point of view.

This invention provides a novel method of making a semiconductor device wherein said deficiencies are obviated.

SUMMARY OF THE INVENTION

A primary object of this invention is to provide a simple method of making a semiconductor device and more particularly a method including a simplified method of assembly and a sealing method combined therewith.

Another object of this invention is to provide an effective method of assembly wherein the position of each lead with respect to each electrode and the position between each lead can be suitably defined by connecting a plurality of outgoing leads to a plurality of electrodes set to a principal surface of a semiconductor element comprising two oppositely placed principal surfaces.

A further object of this invention is to provide a method of making a semiconductor device suitable for mass production.

A still further object of this invention is to provide a method of simply assembling and sealing a semiconductor element comprising electrodes having a relatively large area like a power transistor and thereby to make such an element small and cheap.

According to this invention, there is provided a method of making a semiconductor device which comprises the steps of preparing first and second preformed electrode structures, each including in one body the parts where conductive layers provided on first and second principal surfaces of a semiconductor element are to be connected, outgoing leads joined to said connection parts, and a support member positioned in a predetermined relation with respect to said outgoing leads and said parts for connecting conductive layers; adapting the conductive layer provided on the first principal surface of the semiconductor element to said connection part of the first electrode structure; adapting said connection part of said second electrode structure to the conductive layer provided on said second principal surface of the semiconductor element by fixing said two electrode structures at both the support members in a certain positional relation; connecting said respective conductive layers to the corresponding connection parts; and separating said two electrode structures at said mutually fixed support parts.

Namely, according to this invention, said first and second electrode structures are fixed in a certain positional relation at the respective support parts and only by said simple method the connection parts of the first and second electrode structures are piled up and the positional relation between said two connection parts is readily determined. According to said method, the adaptation of said electrode structures can be done only if the element is placed between said two structures in a fixed position in a state in which said two structures are effectively piled up and this means that the direct positioning of said element and said connection parts can be done with a single process irrespective of the order of the process. It is not always necessary to separately perform said connection process and said adaptation process, but said two processes can be done simultaneously. According to a preferred embodiment of this invention, said outgoing leads are separated from said respective structures and said element is covered with insulators like resin or plastic material, low melting glass, etc., and sealed airtight before said separation process. According to another embodiment of this invention, said structures are provided with a number of outgoing leads, a number of elements are set continuously to the connection parts linked with said outgoing leads and are molded continuously with plastic or resin, and said outgoing leads are continuously separated from said electrode structure. Thus, a method of making semiconductor devices suitable for mass production is provided.

Other objects, features and advantages of this invention will become more apparent from the following detailed descriptions of some embodiments of this invention when taken in conjunction with the accompanying drawings.

BRIEF DESCRIPTION OF THE DRAWING

FIG. 4 is a sectional diagram showing the part for element setting according to an embodiment of this invention, FIG. 5 shows a perspective view of a band-shaped lead structure according to another embodiment of this invention, FIG. 6 is a sectional diagram illustrating a method of lead setting according to a further embodiment of this invention, FIGS. 7*a* and 7*b* are plan views of a band-shaped structure for a collector lead and a band-shaped structure for emitter and base leads according to a still further embodiment of this invention, FIGS. 8*a* and 8*b*, and FIGS. 9*a* and 9*b* are plan views showing the modified form of the structure according to a still further embodiment of the invention.

DESCRIPTION OF THE PREFERRED EMBODIMENT

Now, a method of making a transistor according to some embodiments of this invention will be described in detail hereinbelow.

Figure 1:
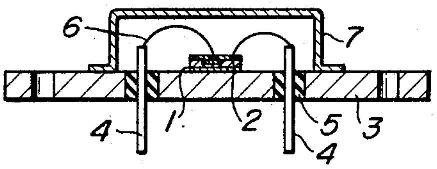
FIG. 1 PRIOR ART
FIG. 1 shows a sectional diagram of a transistor according to the prior art.
Figure 2C:
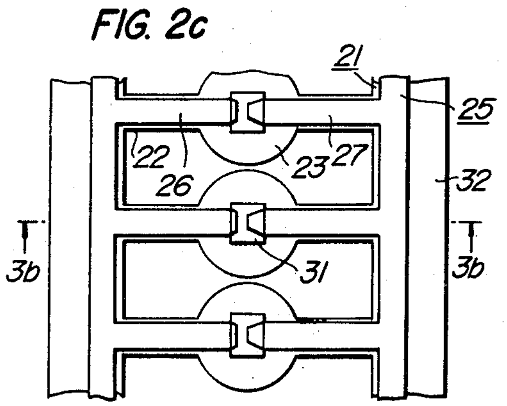
FIGS. 2*a* to 2*e* are views to illustrate a method of making a transistor according to this invention.
Figure 2A:
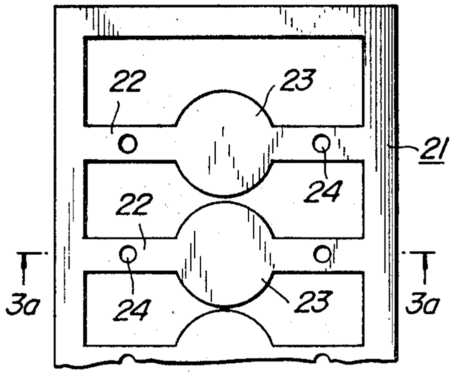

As shown in FIG. 2*a*, a first preformed electrode structure 21 made of tape-shaped or band-shaped conducting material is prepared in the first step. As said material, copper, gold, iron, nickel or alloy containing one of said materials as principal component, clad material of iron, nickel, etc., or iron or nickel, etc. plated with copper, silver, etc. are used. In view of the heat radiation and the mechanical strength, it is preferable to make said structure relatively thick (about 0.3 mm.) in the case of iron, nickel, and rather thick (about 1—2 mm.) in the case of copper, silver. In this embodiment, an iron-nickel alloy plate of 0.3 mm. in thickness plated with silver of about 10 $\mu$ is used. The width of said tape-shaped conducting material is about 50 mm. Said tape-shaped material is mechanically punched with a press while winding the same on a reel to provide a structure comprising ladder-shaped parts to be used as collector outgoing leads (collector electrodes) (width 8 mm., length 30 mm., central parts for elements connection 15 mm. Φ) and a support member (width 10 mm.) as shown in FIG. 2*a*. In this case, such a structure should be formed by photoetching according to a more preferable embodiment of this invention. In this case, the material 21 is processed without the application of mechanical stress and moreover said method is effective for obtaining a small sized structure with which mechanical processing is difficult. It is preferable to make the area of the central part 23 of the outgoing lead 22 large as shown in the FIG. considering the easiness of the setting of the collector electrodes of the semiconductor element in the following step and the heat radiation. Then, holes 24 of about 3 mm. Φ are formed. In this and the following steps, a barrier 30 substantially adapted to the outer diameter of the element is formed to facilitate the mounting of the element (transistor) 31 as shown in FIG. 3*a*, the 3*a*–3*a* sectional view of FIG. 2*a*.

Figure 2D:
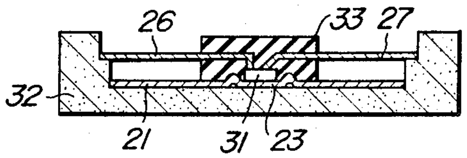
Figure 2B:
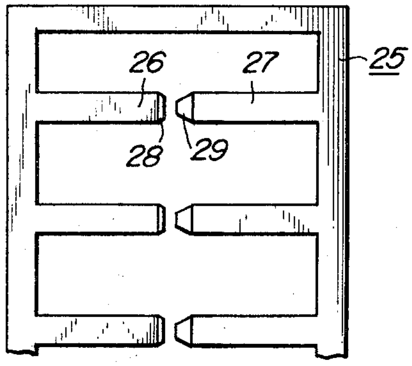

Then, a second preformed electrode structure as shown in FIG. 2*b* made of a second tape-shaped or band-shaped conducting material is provided. Outgoing leads 26 and 27 to be used as an emitter lead and a base lead have a width 2 mm. and length 20 mm. and are formed by the same method as used in obtaining the first structure. The end parts 28 and 29 are tapered and bent slightly downwards to facilitate the adaptation to the electrodes of the element. The width of this structure is slightly larger than the first structure and is about 60 mm.

The processes described hereinabove can be performed simply and abundantly by determining the form of the upper model and the lower model in advance. Further, said processes can be carried out by the combination of press techniques and photoetching techniques. Further, it is not always necessary that the structure 21 for the collector lead has a ladder shape as shown in FIG. 2*a*, but is is permissible to form said structure of the collector lead in a branch as shown in FIG. 2*b*. In other words, it is only required that said plurality of outgoing leads 22 are connected to the conducting material 21 (a support member) at least at one end, and the conducting material (auxiliary support member) coupling the other end works only as an auxiliary.

Figure 3A:
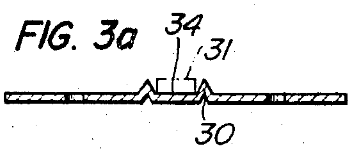
FIGS. 3*a* and 3*b* are sectional diagrams of the transistor cut along the line 3*a*–3*a* in FIG. 2*a* and the line 3*b*–3*b* of FIG. 2*c*, respectively, which illustrate the state of the element and leads setting.

In the next step, a semiconductor element having two principal surfaces positioned face to face to each of which at least one conducting layer (electrode layer) is set, for example, a power planar-type transistor 31 of about 2 mm. × 2 mm. in size is placed at the predetermined position of said connection part 23, for instance, within the box 34 shown in FIG. 3*a* in a way that the collector electrode thereof contacts said position. It is possible to connect the element and said connecting part, if necessary, but in the present case, the element is simply mounted. Said collector electrode is provided by subjecting almost all the parts of one principal surface of the semiconductor element to nickel sintering treatment and forming a solder layer on said sintered surface. Though the emitter and base electrodes are small in size, they are formed by the solder electrodes as described hereinabove. When the emitter and base electrodes of the element are much smaller, it is quite effective to provide a passivation film like $SiO_2$, $SiN_4$, etc. on the surfaces of the element and to form relatively large electrodes on said film. Thereby, it becomes possible to apply this invention to a high frequency high-power semiconductor element. Namely, since said lead parts 28 and 29 are directly connected to the emitter and base electrodes of the element in this embodiment also as explained hereinbelow, the parts for the leads connection of the emitter and base electrodes should be made relatively large, e.g. larger than about $100\mu \times \mu$ in area.

Figure 3B:
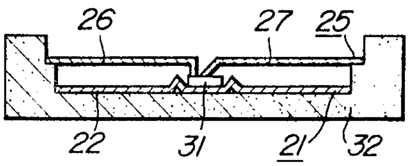

As shown in FIGS. 2*c* and 3*b*, the transistor 31 is mounted on the connection part 23 and the positional relation between the leads 26, 27 and the parts for conductive layer setting 23 is defined by piling up the second structure 25 comprising the outgoing leads to be used as base leads 27 and emitter leads 26 and their respective support member on the first structure 21 with a jig. Thereby, the emitter lead 26 and the base lead 27 are adapted to the emitter electrode and the base electrode, respectively. Then, solder is fused into a heat furnace through the structure shown in FIGS. 2*c* and 3*b* which is still fixed with the jig firmly to connect all of said leads and the corresponding electrodes mechanically and electrically.

Further, as shown in FIG. 2*d*, the element 31 and the connections between the electrodes of the element and the leads are molded with organic resin 33, e.g. epoxy resin.

Figure 2E:
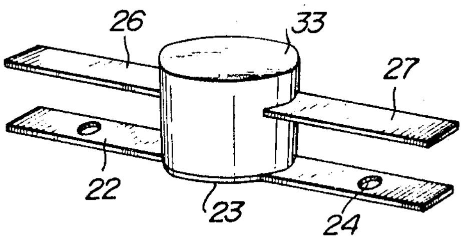

Finally, the support members and the outgoing leads of the structures 21 and 25 are separated to form a transistor structure comprising the outgoing leads which are in contact with the conducting layers (electrodes) of the transistor body 31 and extend in the direction departing from said layers. This transistor structure is shown in FIG. 2*e*.

Though an embodiment of this invention is described, many modifications are possible. In the following, some modified embodiments considered to be preferable by the present inventors will be described.

FIG. 4 shows a sectional diagram of a modified embodiment of the connection part for the electrode of the element, wherein a protruding box 40 is formed in the collector lead 42 to mount the element 41.

FIG. 5 shows a perspective view of the second structure of conducting material 50 wherein the emitter lead 51 and the base lead 52 are punched. In this case, the band-shaped conducting material 50 is formed with a metal plate having a particularly large elastic modulus, e.g. Fe-Ni alloy sheet and said leads 52 add 51 are slightly bend downwards during processing to facilitate the setting to the electrodes.

FIG. 6 is a sectional diagram showing the state wherein a cap jig 64 is utilized to couple the first structure 61 fixed to the jig 60 and the second structure 62 to be adapted reliably to the electrodes of the element on said first structure 61.

FIGS. 7*a* and 7*b* respectively show modified embodiments of the first conducting material (the first structure) 71 and the second conducting material (the second structure) 72 to be adapted to (the first structure) 71. The branch parts (outgoing leads parts) 75 and 76 are placed in such a way that they do not face each other and the materials 71 and 72 overlap mutually at *73a–73a* and *73b–73b*, and *74a–74a* and *74b–74b*.

FIGS. *8a* and *8b* show respectively plan views of first and second structures according to a further embodiment of this invention. In this embodiment, it becomes possible to discriminate the terminals of the structure during and after the manufacturing processes at the lead parts 82, 83, 84 and 85 by the use of the asymmetry of the form of the first structure 80 and the second structure 81. Since the width $w_a$, $w_b$ of the lead parts 82, 84 and the width $W_a$, $W_b$, and the length $l_a$, $l_b$ and $L_a$, $L_b$, are mutually different, the discrimination between the terminals on the emitter and base sides is easy. For example, the values $l_a=5$ mm, $l_b=15$ mm, $L_a=10$ mm, $L_b=25$ mm, $w_a=8$ mm, $w_b=2$ mm, $W_a=10$ mm, $W_b=3$ are chosen.

FIGS. *9a* and *9b* show respectively first and second structures a yet further embodiment of this invention and this embodiment aims at terminal discrimination as the embodiment shown in FIGS. *8a* and *8b*. The branch angles $\theta_a$ and $\theta_b$, $\theta_c$ and $\theta_d$, and $\theta_d$ and $\theta_e$ of the lead parts of the conducting materials (the first and second structures) 90 and 91 are made mutually different and this terminal discrimination is possible. For example, the values $\theta_a$=90°, $\theta_b$=110°, $\theta_c$=90°, $\theta_d$=120°, $\theta_e$=60° are selected.

Figure 10A:
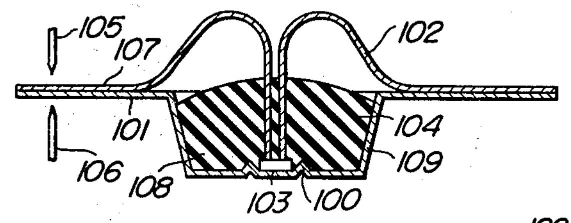
FIGS. 10*a*, 10*b* and 10*c* are sectional diagrams showing the state after the sealing process according to a further another embodiment of the invention.
Figure 10C:
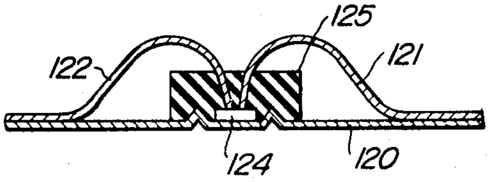
Figure 10B:
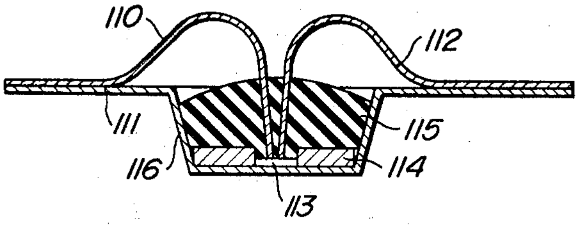

FIGS. 10*a*, 10*b* and 10*c* show sectional diagrams of a still further embodiment of the invention, and illustrate one of the positioning and cutting methods and the modified structure of the element setting part. FIG. 10*a* shows a structure wherein a first box part 100 is formed at the part to which an element 103 is to be set, and a relatively large second box part 109 is formed in order to arrange effectively insulating material 104 including a desiccant and/or high thermal conductivity material. Said two structures are separated at the support members after adapting the outgoing leads 102 to the element 103 by positioning at the support members. According to a concrete example, said separation is done by cutting the right and left sides of the branch parts 107 simultaneously with upper edges 105 and lower edges 106. However, the edges on the right-hand side are not shown in the FIG. As said desiccant molecular sieve, silica-gel, etc. is used and as the high thermal conductivity material, beryllium ceramics, boron nitride resin or the like is used. FIG. 10*b* shows an example of a structure for setting the element 113. The element 113 is maintained easily at the definite position with a support member 114 and the difficulty in setting the emitter and base leads 110 and 112 is obviated. FIG. 10*c* shows a structure wherein the emitter lead 122 and the base lead 121 connected to the element 124 which is set to the collector lead 120 is derived from the upper part of the insulating cover 125. In the above embodiments, the collector lead and the emitter and/or base lead are once piled up and cut simultaneously and then are extended in the predetermined direction. According to this method, the undesirable mechanical deformation of the section is prevented compared with the method wherein the collector lead and the emitter and/or base lead are cut separately or in a mutually separated condition, and further the cutting machine therefor may be simple.

Such an embodiment as represented by FIG. 10*a* is different from the embodiments represented by FIGS. *2c*, *3b*, *2d*, *2e* in positioning at the support members of the first and second structures. Namely, in the embodiments represented by FIGS. *2c*, *3b*, *2d*, *2e* positioning is done with a jig, but in the embodiment represented by FIG. 10*a*, positioning is done directly without a jig by using the positional relation of said outgoing leads and said support members with respect to the electrode layers of the element. Accordingly, said two embodiments are substantially the same in their fundamental object and structure.

Figure 11:
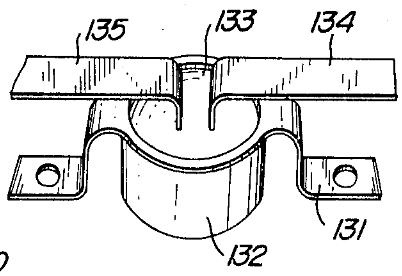
FIG. 11 is a perspective view of a transistor provided according to a further embodiment of the invention.

FIG. 11 is a perspective view showing the state wherein the structure of FIG. 10*a* or 10*b* is set to another suitable support member after all the processes are finished.

In the FIG., 131 indicates the collector lead separated from the support part of the structure and it includes an element and a box 132 for containing an insulating cover 13 covering said element. The emitter lead 134 and the base lead 135 connected to the electrodes of said element extend through the cover 133.

Figure 12A:
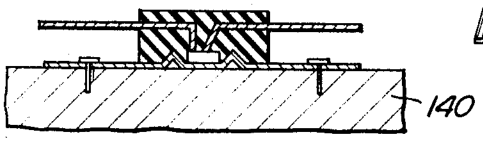
FIGS. 12*a*, 12*b* and 12*c* are sectional diagrams illustrating a method of setting transistors provided according to some embodiments of this invention to a support plate.
Figure 12B:
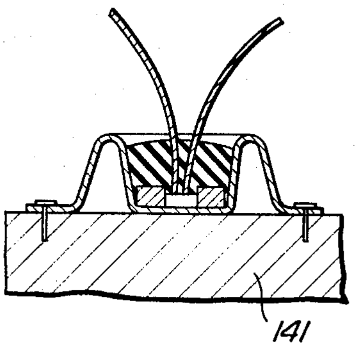
Figure 12C:
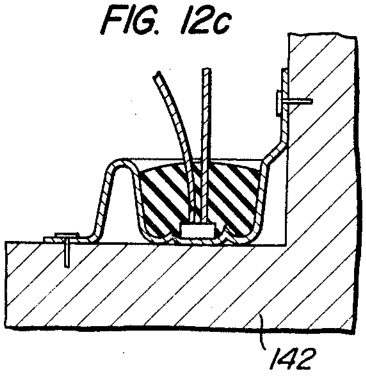

FIGS. 12*a*, 12*b* and 12*c* are sectional diagrams showing the state wherein the transistor provided by some embodiments of this invention is set to various support members or radiator plates 140, 141 and 142. As seen from the FIG., the device provided according to this invention can be used in various ways depending on the situation. Further, since the collector lead of the device obtained by this invention is thin, it can be set to the vicinity of the radiator plate without lowering the efficiency of heat radiation.

Though this invention has been described with reference to some particular embodiments hereinabove, this invention is by no means restricted thereto. Also, this invention has been described in the case of a transistor, but it will be evident for those skilled in the art that this invention can be applied equally well to the manufacture of a diode, a tetrode or a multielectrode element by adjusting the number of leads. Further, the insulating cover is not limited to organic resins, but inorganic materials like low melting glass, etc. may be used. Further, another method may be used wherein a first coating is obtained using a thin insulating film and a second coating is obtained with metal, etc. When said semiconductor element has quite a large dimension or when said element has a large power dissipation, the first and second structures become quite large and it becomes difficult to assemble them in a state where many of them are connected. Therefore, when applying this invention to the assembly of such semiconductor devices, one first structure and one second structure must be used for one element, and thereby a semiconductor element for a remarkably large output can be fabricated easily.

We claim:

1. A method for manufacturing a semiconductor device which comprises the steps of:
- fabricating a semiconductor element having substantially parallel first and second principal surfaces, said element being provided with at least one conducting layer covering a portion of each of said principal surfaces;
- fabricating at least a first and a second sheet electrode structure, each of said electrode structures containing a connecting means to connect said electrode structures to the corresponding conducting layer of said semiconductor element, at least one lead joined to and extending from said connecting means and a means for supporting said lead joined to said lead;
- disposing said conducting layer on the first principal surface of the semiconductor element so as to contact said connecting means of the first electrode structure;
- disposing the connecting means of the second electrode structure so as to contact the conducting layer on the second principal surface of said semiconductor element by fixing said first and second electrode structures at the supporting means; and
- connecting each of said conducting layers of said semiconductor element to the corresponding connecting means of said first and second electrode structures.

2. A method as described in claim 1, further comprising the steps of:
- forming said semiconductor element, said connecting means of said first and second electrode structures connected to the conducting layers of the semiconductor element, into a unitary body with insulating cover material and sealing the same airtight; and
- separating the leads from said supporting means of said structures.

3A method as described in claim 2, further comprising:
- forming an indentation in said connecting means of said first electrode structure;
- disposing said semiconductor element on said connecting means of said first electrode structure so that the conducting layer on said first principal surface contacts the bottom surface of said indentation;

and applying an insulating cover material in a way to fill said indentation and cover said semiconductor element after said connecting means of said second electrode structure are fixed to the remaining conducting layers of said semiconductor element.

4. A method as described in claim 2, wherein said connecting means of said electrode structures are mutually piled up in a way to define the positional relation of said connecting means with respect to said conducting layers, and said leads are mechanically cut simultaneously from said connecting means of said electrode structures in a manner that said connecting means are fixed and the element is molded.

5. A method for manufacturing a semiconductor device comprising:

fabricating a first electrode structure by forming a plurality of holes in a first band-shaped conducting sheet material so as to leave a plurality of elongated portions extending in a direction substantially perpendicular to the elongated direction of said first band-shaped conducting sheet material and equally spaced from and lying parallel to each other and a pair of side portions interposing said plurality of elongated portions and extending substantially parallel to the elongated direction of said band-shaped conducting sheet material;

fabricating a second electrode structure by forming a hole in a second band-shaped conducting sheet material so as to leave a pair of second side portions extending in a direction substantially parallel to the elongated direction of said second band-shaped conducting sheet material and a plurality of first finger portions extending from one of said second side portions into the space between said second side portions and being equally spaced from and parallel to each other, and a plurality of second finger portions extending from the other of said second side portions into the space between said second side portions;

wherein said plurality of elongated portions of said first electrode structure serve as said connecting means and as said lead and said side portions serve as said support member; and wherein said plurality of first and second finger portions of said second electrode structure serve as said connecting means at the free end thereof and as the lead, and said pair of second side portions serve as said support members;

fabricating a semiconductor element having a first and second substantially parallel principal surfaces with a conducting layer on said first principal surface and two conducting layers on said second principal surface, each of said conducting layers covering only a portion of said surfaces;

disposing the conducting layer on the first principal surface so as to be in contact with the connecting means of said first electrode structure;

disposing said connecting means of said second electrode structure so as each of said connecting means contacts a different conducting layer on said second principal surface;

connecting each of said conducting layers of said semiconductor element to the corresponding connecting means of said first and second electrode structure.

6. A method of manufacturing a semiconductor device which comprises:

disposing a semiconductor element, having substantially parallel first and second principal surfaces with at least one conducting layer covering a portion of each of said principal surfaces, on a first electrode structure, said structure comprising a connecting means to connect said electrode structure to one of said conducting layers on said semiconductor element, at least one lead joined to and extending from said connecting means and a support member branching from said lead for supporting said lead, so that the conducting layer on the first principal surface of the semiconductor element contacts said connecting means on said first electrode structure;

disposing a second electrode structure, having at least one connecting means to connect said electrode structure to one of said conducting layers on said semiconductor element, at least one outgoing lead joined to and extending from said connecting means, and a support member branching from said lead for supporting said lead, so as to contact said connecting means with the conducting layer on said second principal surface of said semiconductor element;

and connecting each of said conducting layers of said semiconductor element firmly to the corresponding connecting means of said first and second electrode structures.

7. A method of assembly of a transistor structure, comprising the steps of:

forming a collector lead having a support member by punching a first metal sheet;

punching a second metal sheet to form branch parts to be used as emitter and base leads;

fabricating a transistor structure wherein a collector electrode is formed on a first principal surface and emitter and base electrodes are formed on a second principal surface opposite to said principal surface;

positioning said collector electrode of said transistor substantially at the center of said collector lead;

bending the free end portions of said emitter and base leads;

superimposing and fixing said second metal sheet on said first metal sheet so that the bent free end portions of said emitter and base leads contact the corresponding emitter and base electrodes of said transistor structure;

connecting each of said electrodes and the leads of said metal sheets;

covering said transistor, each part of said two metal sheets connected to the electrodes of the transistor and the vicinity thereof with an insulating material, thus forming the same into one body;

separating the leads from said first and second metal sheets and thereby providing a transistor structure which comprises said collector, base and emitter leads connected to the corresponding electrodes of the emitter, base and collector electrodes of said transistor and extending therefrom, and which is sealed airtightly with said insulating material.

8. A method of manufacturing semiconductor devices, comprising the steps of:

fabricating a first metal plate including a pair of opposed strips and a plurality of first lead portions each bridging said pair of opposed strips;

mounting a semiconductor element on each of said first lead portions, said element including at least two electrodes formed on a first major surface opposed to a second major surface and second major surface facing the corresponding first lead portion;

fabricating a second metal plate including a pair of opposed strips corresponding to the pair of opposed strips of said first metal plate, a plurality of second lead portions each corresponding to one of said two electrodes of the respective element and branched from one of the opposed strips of the second metal plate, and a plurality of third lead portions each corresponding to the other of said two electrodes of the respective element and branched from the other of the opposed strips of the second metal plate;

disposing said second metal plate on said first metal plate having said elements thereon so that the free end portion of each of said second and third lead portions contact the corresponding electrode on the semiconductor element and so that the strips of said second metal plate are superimposed on said first metal plate;

connecting the second major surface and the two electrodes of each of said semiconductor elements with the corresponding first, second and third lead portions, respectively;

covering each of the combination of the semiconductor element, the parts of the lead portions connected to the semiconductor element and the vicinity thereof with organic resinous material to form a unitary body; and separating the lead portions from said opposed strips of said first and second metal plates.